United States Patent [19]
Itoh

[11] Patent Number: 5,620,926
[45] Date of Patent: Apr. 15, 1997

[54] METHOD FOR FORMING A CONTACT WITH ACTIVATION AND SILICIDE FORMING HEAT TREATMENT

[75] Inventor: Hiroshi Itoh, Tokyo, Japan

[73] Assignee: NEC Corporation, Tokyo, Japan

[21] Appl. No.: 503,687

[22] Filed: Jul. 18, 1995

[30] Foreign Application Priority Data

Jul. 21, 1994 [JP] Japan ............................ 6-190190

[51] Int. Cl.$^6$ .................................................. H01L 21/28
[52] U.S. Cl. ........................ 438/530; 438/453; 438/533; 438/664
[58] Field of Search ...................... 437/192, 26, 27, 437/195, 200, 201, 247

[56] References Cited

U.S. PATENT DOCUMENTS

| | | | |
|---|---|---|---|
| 4,558,507 | 12/1985 | Okabayashi et al. | 437/200 |
| 4,788,160 | 11/1988 | Havemann et al. | 437/200 |
| 5,102,827 | 4/1992 | Chen et al. | 437/200 |
| 5,286,678 | 2/1994 | Rastogi | 437/200 |
| 5,314,832 | 5/1994 | Deleonibus | 437/27 |
| 5,330,921 | 7/1994 | Yoshida et al. | 437/25 |
| 5,444,024 | 8/1995 | Anjum et al. | 437/200 |

FOREIGN PATENT DOCUMENTS

| | | |
|---|---|---|
| 0420748 | 4/1991 | European Pat. Off. |
| 0510374 | 10/1992 | European Pat. Off. |
| 59-181672 | 10/1984 | Japan |
| 60-138962 | 7/1985 | Japan |
| 2-114634 | 4/1990 | Japan |
| 3-029321 | 2/1991 | Japan |

OTHER PUBLICATIONS

"Semiconductor Device and Manufacture Thereof", Japio Abstract No. 01660462, Nov. 1985, p. 161.
"Manufacture of Semiconductor Device", Japio Abstract No. 03139134, Jul. 1990, p. 78.

*Primary Examiner*—John Niebling
*Assistant Examiner*—Thomas G. Bilodeau
*Attorney, Agent, or Firm*—Foley & Lardner

[57] ABSTRACT

A field oxide film 12, an n$^+$-type dispersion layer 13, and an interlayer insulating film 14 are formed on a p-type semiconductor substrate, and a contact hole is formed therein. A titanium film 15 is deposited on the surface formed thus far, and arsenic is ion-implanted into a contact region through the titanium film, forming a phosphorus-dispersed layer. The substrate is heat-treated to activate the impurity in the phosphorus-dispersed layer 16 and to cause titanium and silicon to react with each other, thereby forming a titanium silicide film 17 in the contact region. A metal film is then deposited and patterned into a metal wiring 18 without removing a silicon nitride film 15a which has been produced from the titanium film.

5 Claims, 3 Drawing Sheets

FIG. 2(a) (PRIOR ART)
FIG. 2(b) (PRIOR ART)
FIG. 2(c) (PRIOR ART)
FIG. 2(d) (PRIOR ART)
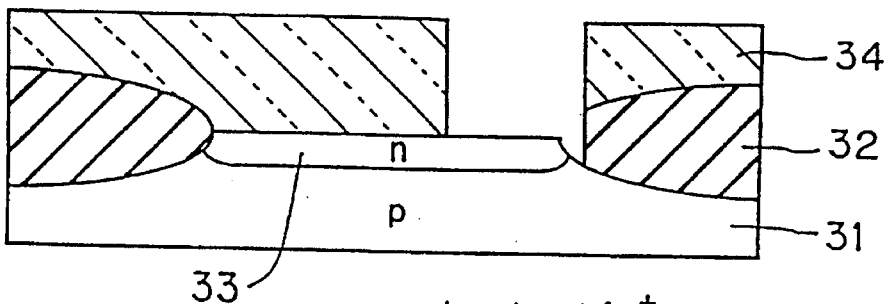
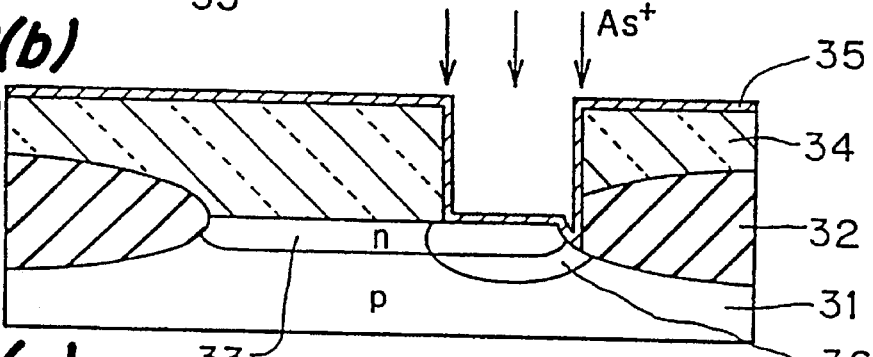
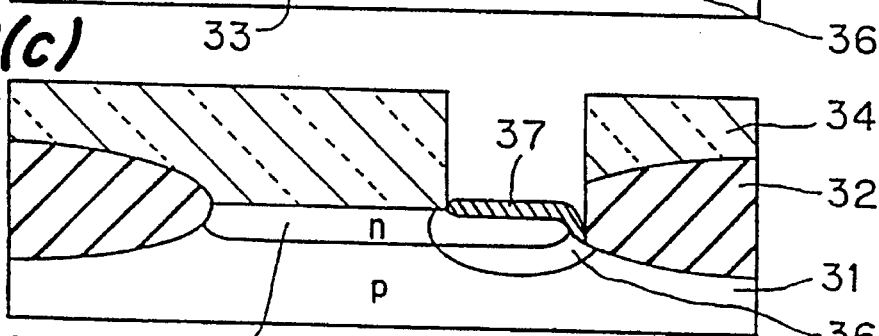
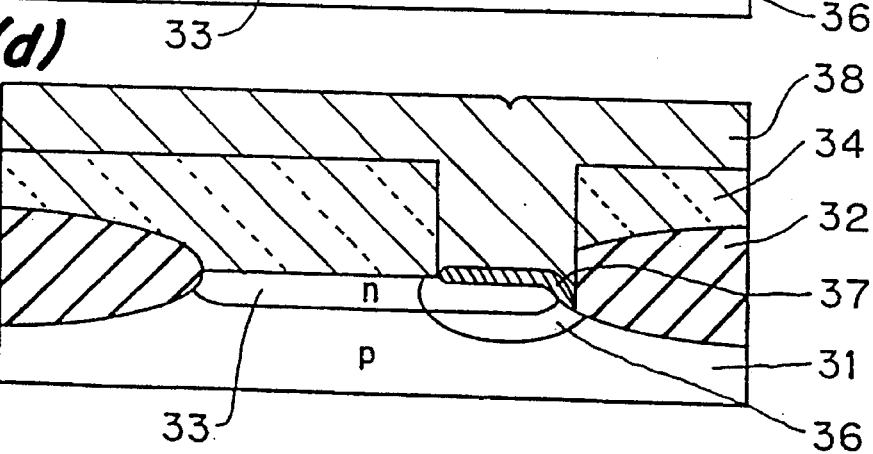

METHOD FOR FORMING A CONTACT WITH ACTIVATION AND SILICIDE FORMING HEAT TREATMENT

BACKGROUND OF THE INVENTION

1. Field of the Invention

The present invention relates to a method for manufacturing semiconductor devices, and more particularly to a method for forming a contact between diffusion layers and metal wirings on a semiconductor substrate and metal wirings extending from the contacts.

2. Description of the Related Art

With the recent trend toward higher degrees of integration of elements and finer circuit patterns on semiconductor devices, contacts for electrically connecting circuit elements and wirings on the semiconductor devices are also formed in finer patterns. This tendency causes the tolerances for any positional misalignments at a manufacturing process between contact regions of diffusion layers formed on semiconductor substrates and contact holes to become severely constrained. If the contact hole is unduly displaced from the contact region of the diffusion layer beyond the tolerances, the wirings are short-circuited to the semiconductor substrate, and hence the semiconductor device will not operate properly.

To avoid the above drawback, it has been the customary practice to introduce, by ion implantation, impurities of the same conductivity type as diffusion layers to which a contact is to be made, through the contact hole, thereby preventing wirings from being short-circuited to the semiconductor substrate.

FIGS. 1(a)–1(d) show successive steps of a conventional process (hereinafter referred to as a first prior art) to manufacture semiconductor devices. In the illustrated process, a positional misalignment occurs at a manufacturing process between a contact region of a diffusion layer and a contact hole.

First, as shown in FIG. 1(a), a field oxide film 22 is selectively formed on a p-type semiconductor substrate 21, and an n$^+$-type diffusion layer 23 is formed in an active region which is not covered with the field oxide film 22. Thereafter, the entire surface formed thus far is covered with an interlayer insulating film 24, and a contact hole is defined in the interlayer insulating film 24, thereby exposing the substrate surface through the contact hole.

Then, as shown in FIG. 1(b), an oxide film 29 is grown to a thickness in the range of from 10 to 30 nanometers (nm) on the entire surface of the substrate, following which phosphorus (P) is ion-implanted into a contact region under condition that energy is 50 keV and dosage is $1\times10^{15}$ cm$^{-2}$. Subsequently, the substrate is annealed at 800° C. for about 10 minutes to activate the ion-implanted phosphorus, thereby forming a phosphorus-dispersed layer 26.

The oxide film 29 is provided to prevent channeling of the implanted ions, to prevent a silicon surface from being contaminated with metal impurities upon ion implantation, and to prevent phosphorus from being out-diffused when the substrate is annealed.

After the anneal, as shown in FIG. 1(c), the oxide film 29 is removed by etching, thereby exposing the substrate surface in the contact hole.

Then, as shown in FIG. 1(d), a barrier metal layer 25 and a metal wiring 28 are formed, thereby completing a semiconductor device. The barrier metal layer 25 may be in the form of a titanium (Ti) film, a titanium nitride (TiN) film, or a combination thereof.

Modifications of the aforesaid prior art, particularly with respect to the formation of a silicide in the contact hole, are disclosed in Japanese Patent Laid-open Nos. 3-29321, 2-114634, and 60-138962. Japanese Patent Laid-open No. 3-29321 discloses a process (hereinafter referred to as a second prior art), in which after ions are implanted into a contact region, a silicide forming material is deposited on the substrate surface and annealed to form a silicide in the contact hole, and thereafter a metal wiring is formed.

FIGS. 2(a)–2(d) show successive steps of an improved process (hereinafter referred to as a third prior art) for manufacturing semiconductor devices as disclosed in Japanese Patent Laid-open Nos. 2-114634 and 60-138962. In this process, a positional misalignment occurs at a manufacturing process between a contact region of a dispersion layers and contact holes.

First, as shown in FIG. 2(a), a field oxide film 32 is selectively formed on a p-type semiconductor substrate 31, and an n$^+$-type diffusion layer 33 is formed in active regions which is not covered with the field oxide film 32. Thereafter, the entire surface formed thus far is covered with an interlayer insulating film 34, and a contact hole is formed in the interlayer insulating film 34, thereby exposing the substrate surface through the contact hole.

Then, as shown in FIG. 2(b), a metal of a high melting point, such as molybdenum (Mo) or the like, is deposited on the entire surface formed thus far, thereby forming a high melting-point metal film 35 having a thickness of about 50 nm. Thereafter, an n-type impurity such as of arsenic (As) or the like is ion-implanted into the contact region under such condition that energy is 70 kev and dosage is $4\times10^{15}$ cm$^{-2}$, thereby forming an arsenic-diffused layer 36.

Thereafter, as shown in FIG. 2(c), the molybdenum on the surface of the silicon substrate in the contact hole is silicided by being heat-treated at 550° C. for about 30 minutes, thus forming a silicide film 37. Thereafter, the high melting-point metal which has not been silicided is removed by etching.

Then, as shown in FIG. 2(d), a metal wiring 38 is formed on the surface formed thus far, thereby completing a semiconductor device.

In the first prior art process, since ions are implanted through the oxide film, oxygen (O) in the oxide film is also implanted, together with phosphorus, into the substrate, causing an increase in the contact resistance and a degradation in the reliability of the contact between the n$^+$-type diffusion layer and the metal wiring. Furthermore, the oxide film needs to be formed for implantation of ions and then to be removed, and the barrier metal layer also needs to be formed. Accordingly, the first prior art process has a drawback such that it is complex and is composed of many steps.

The second prior art process enables reduction of the process steps because ions are implanted into the contact region without the need for forming an oxide film. Since ions are introduced into the surface of the silicon substrate which is exposed, it is impossible to prevent metal impurities such as of Fe or the like discharged from an ion implantation apparatus from being introduced into the surface of the silicon substrate when the ions are implanted. The metal impurities thus introduced are trapped in the defects in the silicon substrate, lowering the performance thereof, causing an increased leakage. The second prior art process has such a problem that ions implanted into the surface of the silicon substrate tend to cause channeling, resulting in an increase of the contact resistance.

The third prior art process shown in FIGS. 2(a)–2(d) also does not require the formation and removal of an oxide film because impurities are ion-implanted into the contact region through the high melting-point metal film. However, when an unreacted part of the high melting-point metal is removed after annealing, the surface of the silicide in the contact hole is exposed to the atmosphere, thereby forming a thin native oxide film, with the result that there are variations in the contact resistance and lowering of reliability.

The above shortcomings can be alleviated by removing by etching, the insulating oxide film. However, an additional etching step is required, and the thickness of the silicide film in the contact hole is reduced in the etching step.

SUMMARY OF THE INVENTION

It is therefore an object of the present invention to provide a method for manufacturing semiconductor devices with a contact in which variations in the resistance can be reduced and high reliability can be achieved, through a reduced number of process steps.

To accomplish the above object, there is provided in accordance with the present invention a method for manufacturing semiconductor devices, comprising the steps of:

(1) forming an insulating film on a surface of a silicon substrate;

(2) forming an opening in the insulating film to partially expose the surface of the silicon substrate through the opening;

(3) depositing a high melting-point metal on the entire surface including the opening to form a film of high melting-point metal;

(4) implanting impurity ions selectively into the surface of the silicon substrate in the opening through the high melting-point metal film;

(5) heat-treating the silicon substrate to activate the implanted impurity ions and to selectively form a high melting-point metal silicide on the surface of the silicon substrate in the opening; and (6) growing a metal film on the high-melting-point metal which has not been silicided and the silicide generated in the annealing step (5).

The above and other objects, features, and advantages of the present invention will become apparent from the following description when taken in conjunction with the accompanying drawings which illustrate a preferred embodiment of the present invention by way of example.

BRIEF DESCRIPTION OF THE DRAWINGS

FIGS. 2(a)–2(d) are fragmentary cross-sectional views showing a third prior art process for manufacturing a semiconductor device.

DETAILED DESCRIPTION OF THE PREFERRED EMBODIMENT

FIGS. 3(a)–3(d) show successive steps of a method for manufacturing a semiconductor device according to the present invention. In the illustrated method, a positional misalignment occurs at a manufacturing stage between a contact region of a dispersion layer and a contact hole as shown in the prior art processes.

Figure 1A:
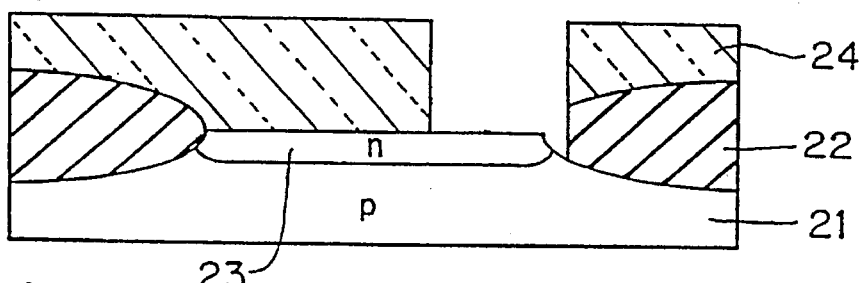
FIGS. 1(a)–1(d) are fragmentary cross-sectional views showing a first prior art process for manufacturing a semiconductor device.
Figure 1B:
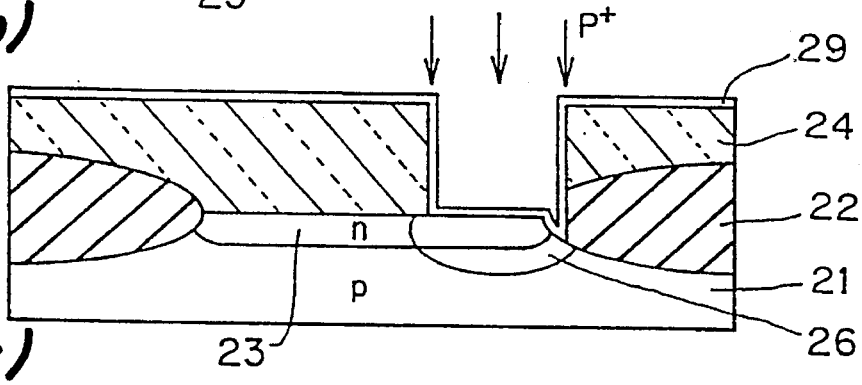
Figure 1C:
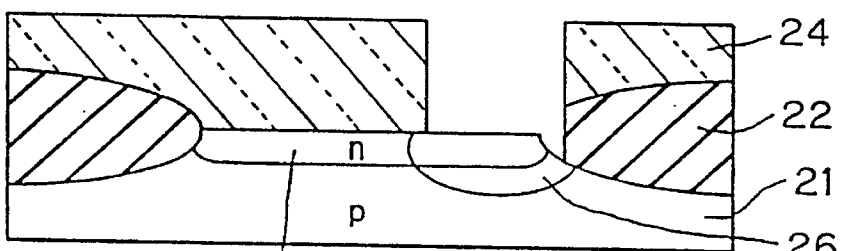
Figure 1D:
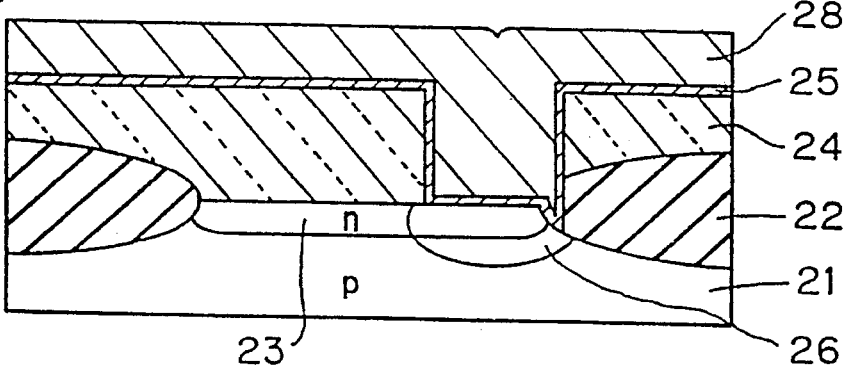
Figure 3A:
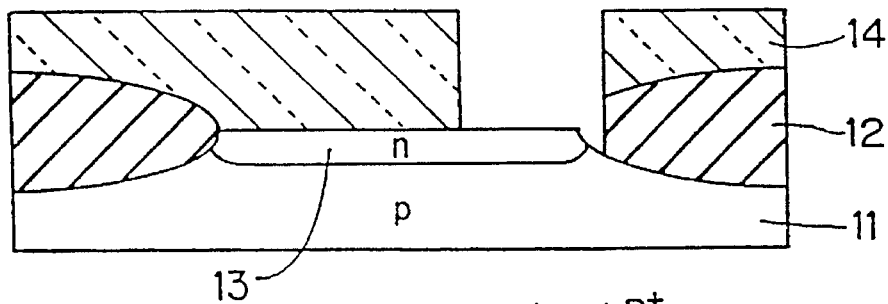
FIGS. 3(a)–3(d) are fragmentary cross-sectional views showing a method for manufacturing a semiconductor device according to the present invention.

First, as shown in FIG. 3(a), the surface of a p-type semiconductor substrate 11 of single-crystal silicon which has a specific resistance ranging from 5 to 15 Ω·cm is selectively oxidized by a LOCOS process to form a field oxide film 12 having a thickness of 500 nm. Arsenic ions of about $1 \times 10^{15}$ cm$^{-2}$ are implanted into an active region surrounded by the field oxide film 12, thus forming an n$^+$-type diffusion layer 13. Thereafter, a silicon oxide film is deposited to a thickness of 1.0 μm by chemical vapor deposition (CVD), thereby forming an interlayer insulating film 14. Then, the interlayer insulating film 14 on the n$^+$-type diffusion layer 13 is selectively etched to form a contact hole therein which has a contact diameter of 0.35 μm.

Figure 3B:
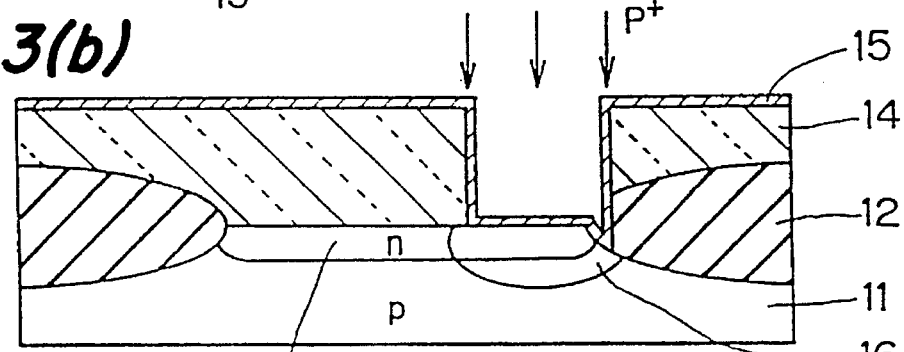

Then, as shown in FIG. 3(b), titanium is deposited on the entire surface of the semiconductor substrate by sputtering, thereby forming a titanium film 15. The titanium film 15 will eventually serve as a barrier metal layer. The titanium film 15 has a thickness ranging from 10 to 100 nm. The thickness of the titanium film 15 is selected to be of 10 nm or greater for the following reason. Since the aspect ratio of a contact hole in a semiconductor device formed in a fine pattern is 2 or more (in this embodiment 1.0/0.35≈2.9), if the thickness of the titanium film were of 10 nm or less, then the thickness of the titanium film in the contact hole would be of 5 nm or less, and hence the titanium film would not serve as a barrier metal layer. The thickness of the titanium film 15 should be of 100 nm or less for the reasons given later on.

After the titanium film 15 is deposited, phosphorus is ion-implanted through the titanium film 15 into a contact region at an energy of 50 keV and a dosage of $1 \times 10^{15}$ cm$^{-2}$, thereby forming a phosphorus-dispersed layer 16. This step is advantageous in that when phosphorus ions are implanted, the silicon (Si) and the titanium (Ti) are mixed with each other, lowering the temperature of a phase transition from a crystal structure C49 to C54 of TiSi$_2$ in the reaction to silicide the titanium, by about 20° to 30° C., so that the titanium siliciding reaction is performed with increased stability.

Figure 3C:
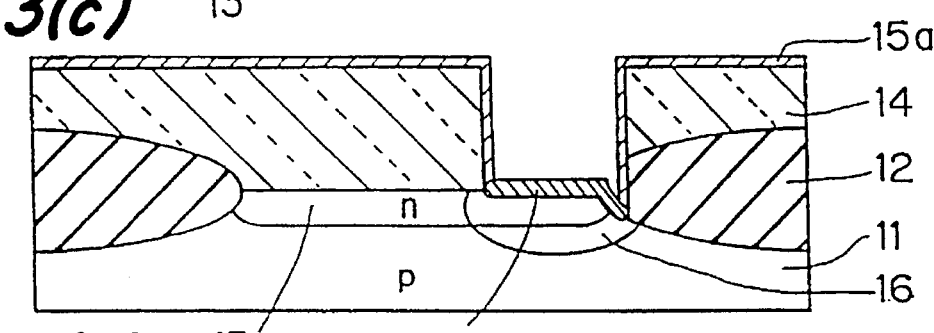

Further, in order to activate the implanted phosphorus ions, the substrate is annealed at 750° C. for 30 seconds in a nitrogen atmosphere by a rapid thermal anneal (RTA) process. And when the substrate is annealed, the titanium and the silicon react with each other, forming a titanium silicide film 17 in the contact region as shown in FIG. 3(c). The whole or a part of the titanium which has not been silicided is nitrided to titanium nitride (TIN).

The substrate is annealed in a temperature range from 650° C. to less than 850° C. If the substrate is annealed at a temperature lower than 650° C., then since the implanted phosphorus ions will not sufficiently be activated, the implantation of phosphorus ions into the contact region will not be effected. If the substrate is annealed at a temperature of 850° C. or higher, then the titanium silicide film 17 formed in the contact region will be agglomerated, resulting in scattering of the contact resistance. Such scattering of the contact resistance are large particularly when the diameter of the contact hole is of 1.5 μm or greater.

Figure 3D:
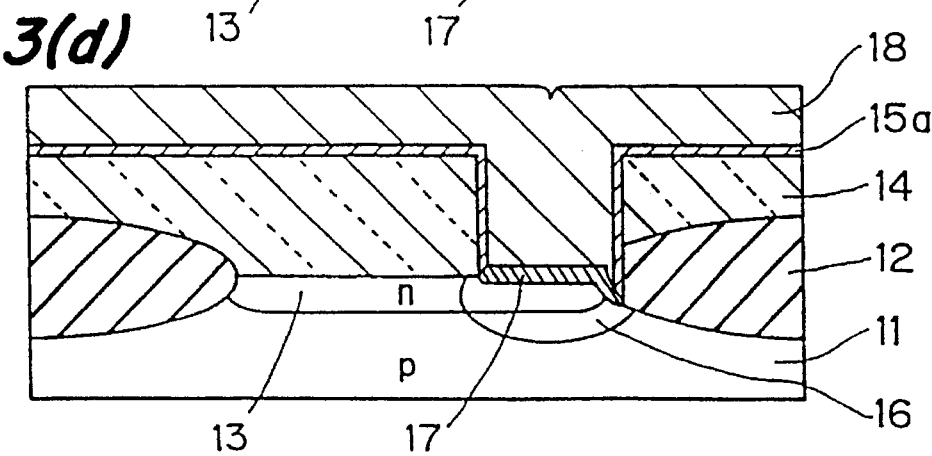

Thereafter, as shown in FIG. 3(d), leaving the generated titanium nitride film 15a (which may contain a titanium metal) as it is, a metal film as of aluminum is deposited over the entire surface formed thus far, thereby forming a metal wiring 18 by photolithography.

For example, a laminated metal wiring of aluminum (Al)/titanium nitride (TIN) has a life time against electromigration which is extraordinarily greater than the life time of a wiring composed of a single layer of aluminum. The specific resistance of aluminum is about 3 Ω/cm whereas the specific resistance of titanium nitride is about 100 Ω/cm. Therefore, titanium nitride is effective against electromigration, but not effective in reducing the resistance of a metal wiring. If the film thickness of titanium nitride is increased, its resistance is lowered. However, if film thickness of titanium nitride is increased to 100 nm or greater, then the capacitance between wirings would be increased, so that the time constant of CR would be increased and the speed of circuit operation would be degraded. An excessive film thickness of titanium nitride would result in an excessive increase in the overall film thickness of metal wiring, making it impossible to embed an insulating film between metal wirings. For these reasons, the thickness of the titanium film should preferably be 100 nm or less.

In the method of manufacturing a semiconductor device according to the present invention, a high melting-point metal is deposited on the surface of a substrate after a contact hole is formed therein, and ions are implanted into the substrate through the high melting-point metal. Thereafter, the substrate is annealed simultaneously to activate the implanted ions and convert the high melting-point metal into a silicide. Therefore, a contact which is of a low resistance and is stable can be produced in a smaller number of steps than the conventional processes. Since the high melting-point metal is left as a part of a metal wiring, it is possible to form a laminated metal wiring which is highly resistant to electromigration without involving an increase in the number of steps of the method for manufacturing a semiconductor device. Because the formed silicide film is protected from exposure to the atmosphere, its surface is prevented from being oxidized, and hence the contact resistance is prevented from being increased.

Although a certain preferred embodiment of the present invention has been shown and described in detail, it should be understood that various changes and modifications may be made therein without departing from the scope of the appended claims.

What is claimed is:

1. A method for manufacturing a semiconductor device, comprising the steps of:
   (1) forming an insulating film on a surface of a silicon substrate;
   (2) forming an opening in said insulating film to partially expose the surface of said silicon substrate through said opening;
   (3) depositing a refractory metal on the surface of said silicon substrate, said insulating film and a sidewall of said opening;
   (4) implanting impurity ions selectively into the surface of said silicon substrate in said opening through said refractory metal;
   (5) heat-treating the silicon substrate to activate the implanted impurity ions and to selectively form a refractory metal silicide on the surface of said silicon substrate in said opening; and
   (6) growing a metal film on the refractory metal which has not been silicided and on the silicide generated in the heat-treating step (5).

2. A method according to claim 1, wherein said refractory metal which is deposited in the depositing step (3) comprises titanium, said refractory metal having a thickness ranging from 10 to 100 nm.

3. A method according to claim 2, wherein said heat-treating step (5) is carried out in a nitrogen atmosphere in a temperature range from 650° C. to less than 850° C.

4. A method according to claim 1, wherein said heat-treating step (5) is carried out in a nitrogen atmosphere.

5. A method according to claim 1, wherein said impurity ions comprise phosphorus ions.

* * * * *